United States Patent
Chen et al.

(10) Patent No.: US 7,828,566 B2
(45) Date of Patent: Nov. 9, 2010

(54) ELECTRICAL CONNECTOR HAVING AN EJECTOR FOR LOCKING AND EJECTING A MODULE

(75) Inventors: De-Xi Chen, Kunshan (CN); Xue-Wu Bu, Kunshan (CN); Ting-Shun Liu, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 101 days.

(21) Appl. No.: 12/288,532

(22) Filed: Oct. 20, 2008

(65) Prior Publication Data

US 2009/0186502 A1 Jul. 23, 2009

(30) Foreign Application Priority Data

Oct. 19, 2007 (CN) .................... 2007 2 0043777 U

(51) Int. Cl.
*H01R 13/62* (2006.01)
(52) U.S. Cl. ...................... 439/157; 439/936
(58) Field of Classification Search ................ 439/160, 439/157, 327
See application file for complete search history.

(56) References Cited

U.S. PATENT DOCUMENTS

| | | | |
|---|---|---|---|
| 4,684,192 A * | 8/1987 | Long et al. ................ 439/374 |
| 4,896,397 A * | 1/1990 | Elliott .......................... 16/422 |
| 5,506,758 A * | 4/1996 | Cromwell .................... 361/798 |
| 5,746,614 A | 5/1998 | Cheng et al. |
| 6,599,142 B2 * | 7/2003 | Bu .............................. 439/157 |
| 6,616,466 B2 | 9/2003 | Frantum, Jr. et al. |
| 7,210,955 B2 | 5/2007 | Ringler et al. |
| 7,233,500 B2 * | 6/2007 | Yu .............................. 361/737 |
| 7,245,499 B2 * | 7/2007 | Stahl et al. .................. 361/754 |
| 7,500,863 B2 * | 3/2009 | Ringler et al. .............. 439/327 |
| 2009/0014934 A1 * | 1/2009 | Seber .......................... 269/207 |

\* cited by examiner

*Primary Examiner*—Neil Abrams
(74) *Attorney, Agent, or Firm*—Wei Te Chung; Andrew C. Cheng; Ming Chieh Chang

(57) ABSTRACT

A card edge connector (100) for receiving a module (200) includes an elongated insulative housing (1) having a receiving slot (19) for receiving the module and at least one arm portion (10) positioned at one end of the insulative housing. The arm portion (10) has a pair of side walls (11) and a recess (12) located therebetween. Each side wall has a stopper (14) extending in the recess. A sets of terminals (2) are mounted on said insulative housing and extend into the receiving slot thereof. A latch (3) is adapted to be rotatably received in the recess (12). The latch includes an ejecting portion (33) for ejecting the module out of the receiving slot, a locking portion (34) for locking the module into the receiving slot and a pair of projections (31) formed on opposite sides thereof for cooperating with the stoppers (14). The projection (31) has a side surface (312) coated with a lubricant film (315) thereon for interfering engagement with the stopper (14) when the latch is rotated inwardly.

10 Claims, 6 Drawing Sheets

US 7,828,566 B2

ELECTRICAL CONNECTOR HAVING AN EJECTOR FOR LOCKING AND EJECTING A MODULE

BACKGROUND OF THE INVENTION

1. Field of the invention

The present invention generally relates to a card edge connector for receiving a module and more particularly to a card edge connector having at least a latch for retaining the module into the connector.

2. Description of Related Art

A conventional card edge connector is fixed in an electronic device such as a computer for receiving a memory module. Such connector is mounted on a printed circuit board (PCB), and includes an elongated insulative housing, a plurality of terminals received therein and a pair of latches rotatably attached thereto so as to eject the memory module out of the insulative housing or retain the memory module in the insulative housing. The insulative housing has a pair of arm portions positioned on two longitudinal opposite ends thereof. Each arm portion has a pair of side walls and a recess located therebetween for receiving the latch. Each side wall has a stopper extending in the recess. Each latch has a pair of projections formed on opposite sides thereof for cooperating with the stoppers. When the memory module is received in the insulative housing, the projections abut against the corresponding stoppers to prevent the latches from outward rotation easily.

However, in assembling the memory module to the card edge connector, the latches are rotated inwardly so as to lock the memory module into the insulative housing, and the projections will have a friction with the corresponding stoppers when the latches are being rotated inwardly, thereby, both the projections and the stoppers will be abraded easily.

Hence, an improvement over the prior art is required to overcome the problems thereof.

SUMMARY OF THE INVENTION

According to one aspect of the present invention, a card edge connector for receiving a module comprises an elongated insulative housing having a receiving slot for receiving the module and at least one arm portion positioned at one end of the insulative housing. Said arm portion has a pair of side walls and a recess located therebetween. Each side wall has a stopper extending in the recess. A plurality of terminals are mounted on said insulative housing and extend into the receiving slot thereof. A latch is adapted to be rotatably received in the recess. The latch includes an ejecting portion for ejecting the module out of the receiving slot, a locking portion for locking the module into the receiving slot and a pair of projections formed on opposite sides thereof for cooperating with the stoppers. The projection has a side surface coated with a lubricant film thereon for interfering engagement with the stopper when the latch is being rotated inwardly.

According to another aspect of the present invention, a card edge connector for receiving a module comprises an elongated insulative housing having a receiving slot for receiving the module, a plurality of passageways positioned at two lateral sides of the receiving slot and a pair of arm portions positioned at two elongated opposite ends of the insulative housing. Each arm portion has a pair of side walls and a recess located therebetween. Each side wall has a stopper extending into the recess. A plurality of terminals are received in the passageways and extending into the receiving slot thereof. A pair of latches are adapted to be rotatably received in the recesses. Each latch includes an ejecting portion for ejecting the module out of the receiving slot, a locking portion for locking the module into the receiving slot and a pair of projections formed on opposite sides thereof for cooperating with the stoppers. Each stopper has an outer surface coated with a lubricant film thereon for interfering engagement with the projection when the latch is being rotated inwardly.

These and additional objects, features, and advantages of the present invention will become apparent after reading the following detailed description of the preferred embodiment of the invention taken in conjunction with the appended drawings.

DETAILED DESCRIPTION OF THE INVENTION

Figure 1:
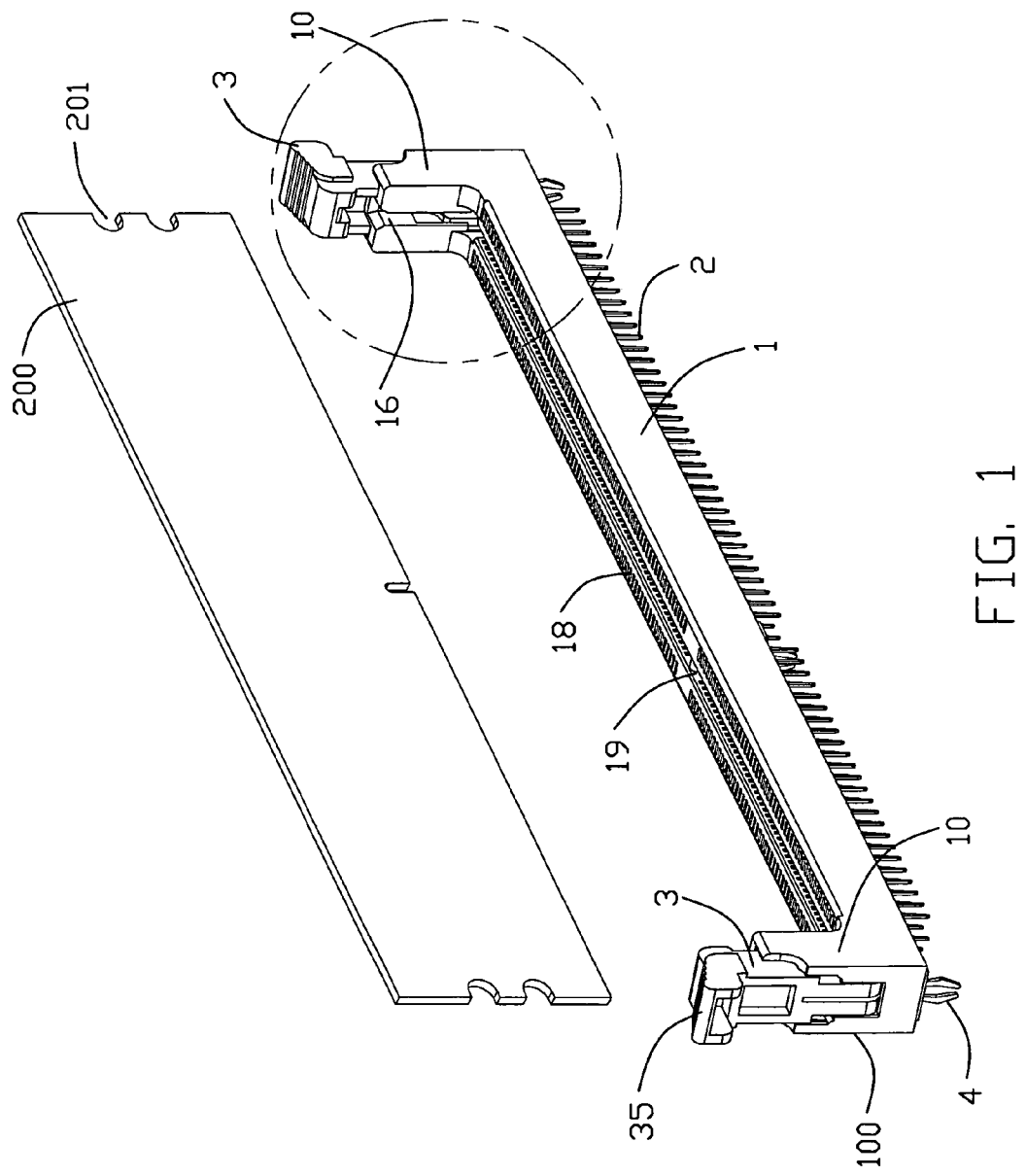
FIG. 1 is a perspective view of a card edge connector and a memory module to be received therein according to the present invention.
Figure 2:
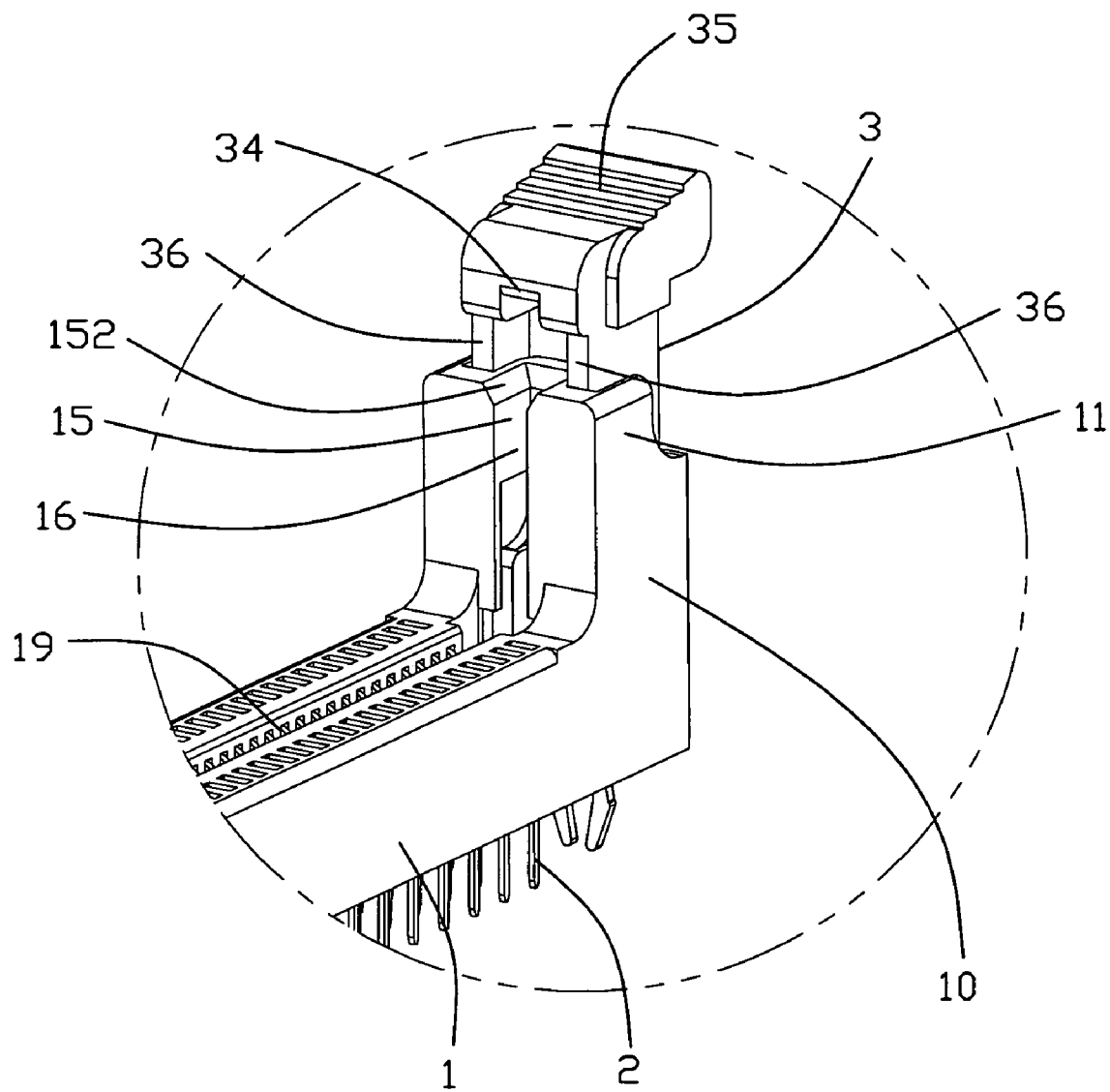
FIG. 2 is a partly enlarged view taken from a circle shown in FIG. 1.

Reference will now be made to the drawing figures to describe the preferred embodiment of the present invention in detail.

Figure 3:
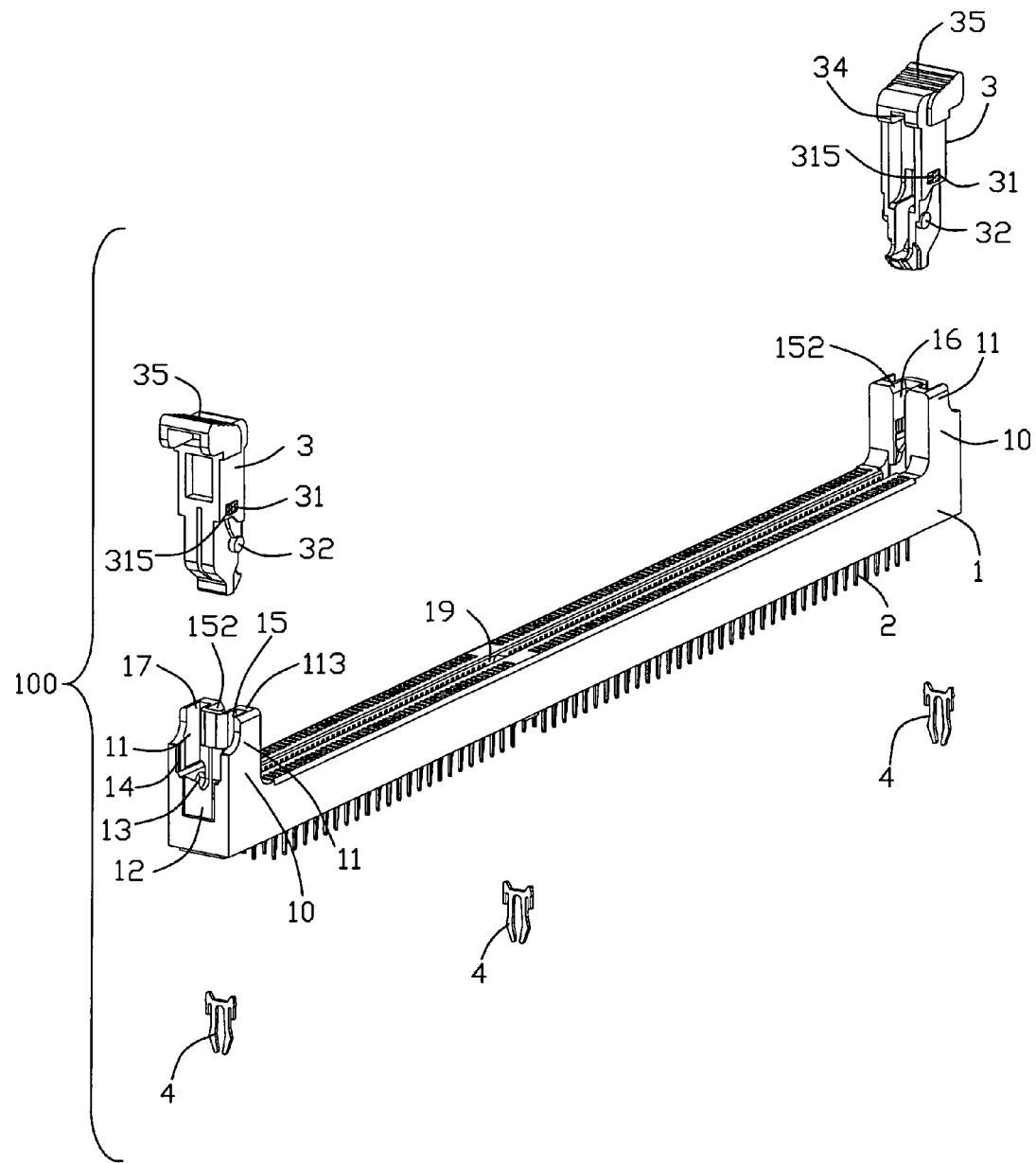
FIG. 3 is an exploded view of the card edge connector shown in FIG. 1.

Referring to FIGS. 1 and 3, the card edge connector 100 according to the present invention for insertion of a memory module 200, comprises an elongated insulative housing 1, a plurality of terminals 2 assembled to the insulative housing 1, a pair of latches 3 rotatably attached to the insulative housing 1 and a pair of board locks 4 coupled to the insulative housing 1 for locking the insulative housing 1 into a printed circuit board (PCB).

Referring to FIGS. 1-5, the insulative housing 1 is made of plastic materials, and has a receiving slot 19 formed along a longitudinal direction thereof for receiving the memory module 200 and two rows of passageways 18 disposed on two lateral opposite sides of the receiving slot 19. The terminals 2 are received in the passageways 18 and extending into the receiving slot 19 for electrical connection to electrical pads on the memory module 200. A pair of arm portions 10 extends upwardly from opposite ends of the insulative housing 1. Each arm portion 10 includes a pair of side walls 11, a recess 12 located between the side walls 11, a pair of guiding walls 15 parallel to the side walls 11, and a guiding slot 16 formed between the guiding walls 15 and communicating with the receiving slot 12 for receiving a side edge of the memory module 200. Each side wall 11 has a hole 13 communicating with the recess 12 and a stopper 14 extending from an inner side of the side wall 11 into the recess 12. Each guiding wall 15 has a guiding face 152 on upper ends thereof for facilitating insertion of the memory module 200. Each side wall 11 and guiding wall 15 are interconnected by a connecting wall 113 and define a slit 17 formed therebetween.

Figure 4:
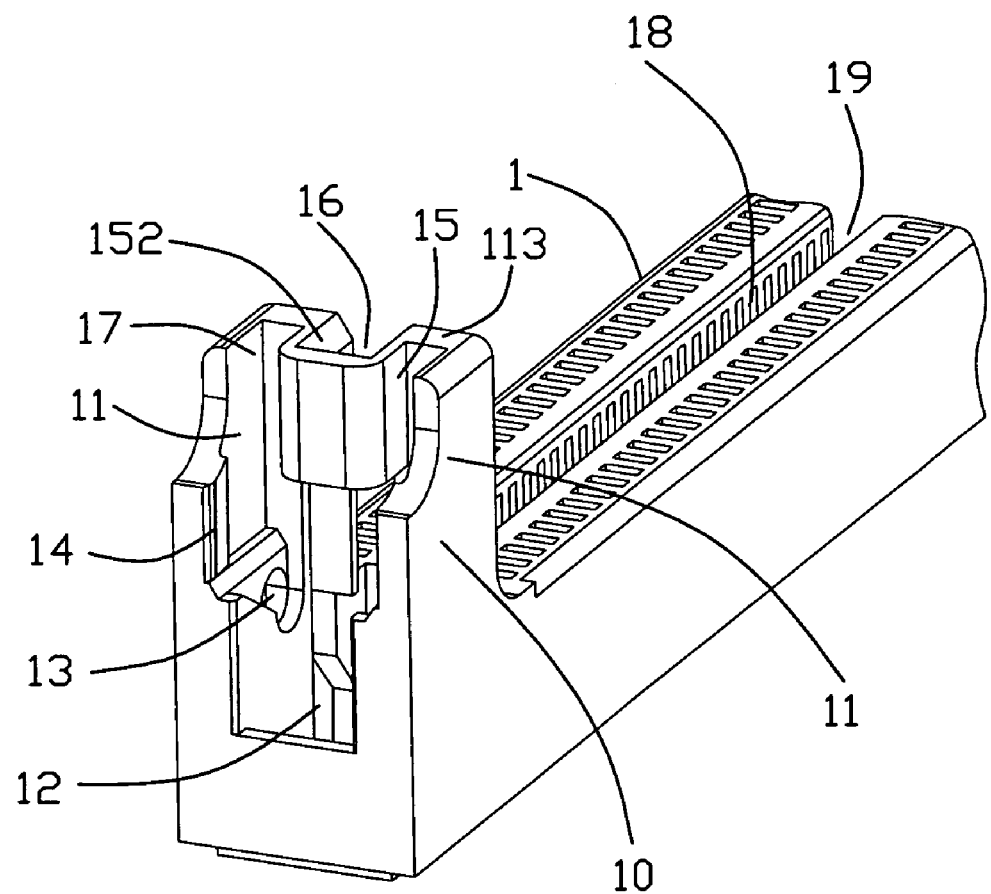
FIG. 4 is a partly perspective view of an insulative housing shown in FIG. 1.
Figure 5:
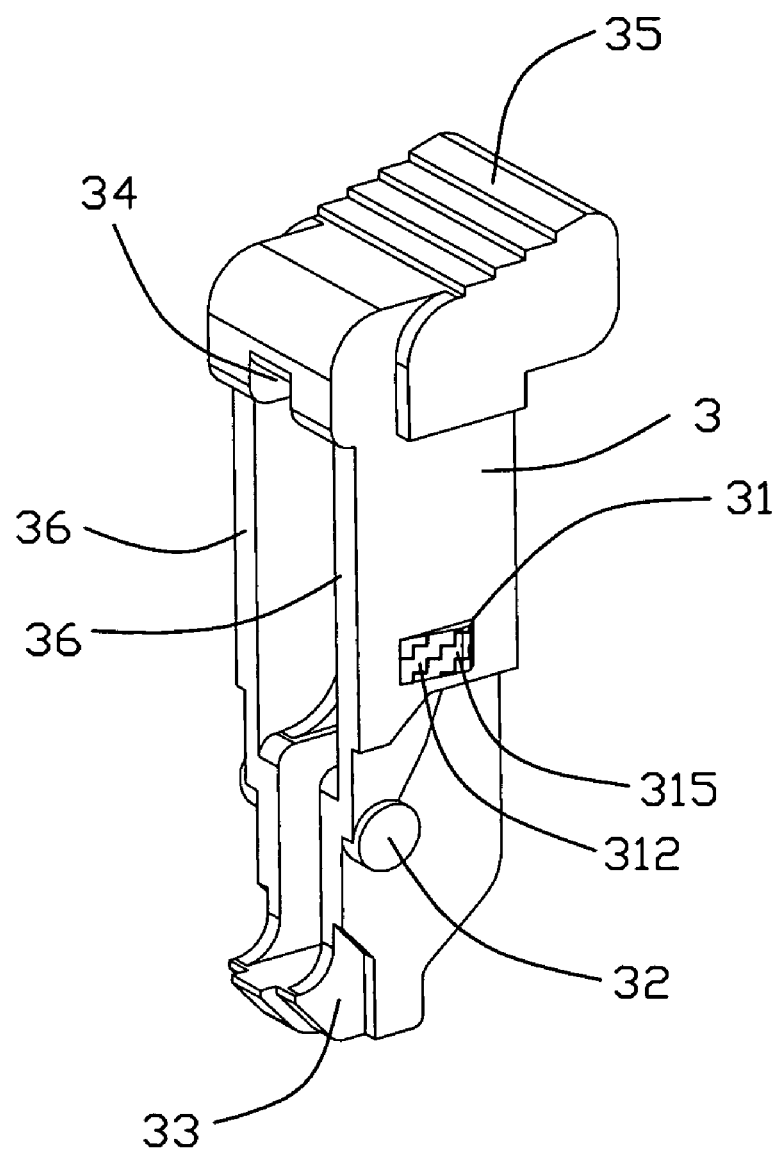
FIG. 5 is a perspective view of a latch shown in FIG. 1.
Figure 6:
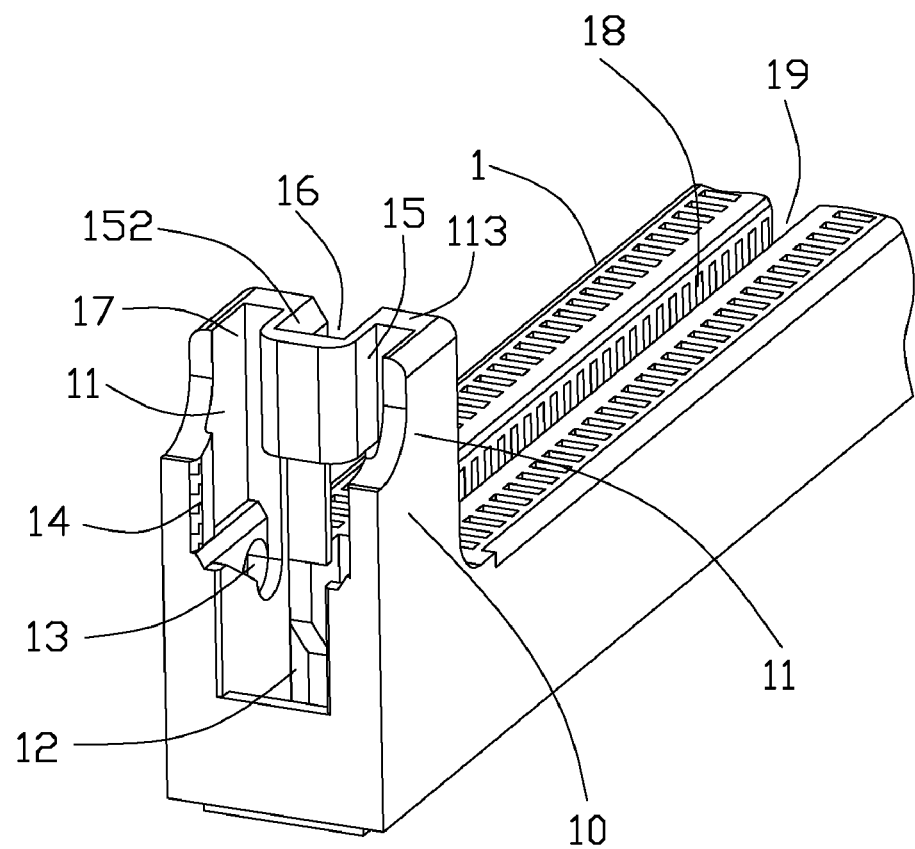
FIG. 6 is a partly perspective view of an insulative housing of a card edge connector according to another embodiment of the present invention.

Referring to FIGS. 3-5, the latches 3 are received in the recesses 12. Each latch 3 includes a pair of retaining walls 36 parallel to each other. Each retaining wall 36 has a projection 31 and a spindle 32 both formed on an outer surface thereof. The spindle 32 is rotatably received in the holes 13 of the insulative housing 1, therefore, the latch 3 could be rotated relative to the insulative housing 1. The projection 31 has a side surface 312 extending inwardly and slantwise towards the receiving slot 19. The side surface 312 has a lubricant film 315 coated thereon. The latch 3 has an ejecting portion 33 extending inwardly at a bottom portion thereof, a locking portion 34 extending inwardly and a gripping portion 35 extending outwardly at a top portion thereof.

Referring to FIGS. 1-5, in assembling the memory module 200 to the card edge connector 100, a bottom edge of the memory module 200 is inserted into the receiving slot 19 and presses the ejecting portions 33 so as to rotate the latches 3 relative to the insulative housing 1 inwardly. At the same time, the side surfaces 312 of the projections 31 will have a friction with outer surfaces of the corresponding stoppers 14 when the latches 3 are being rotated inwardly. The lubricant films 315 which are coated on the side surfaces 312 could reduce the friction between the projections 31 and the stoppers 14 so as to decrease abrasion of the projections 31 and the stoppers 14. In another alternative embodiment according to the present invention, the lubricant films 315 could be coated on the outer surfaces of the stoppers 14, or the lubricant films 315 could be coated both on the side surfaces 312 of the projections 31 and the outer surfaces of the stoppers 14. When the memory module 200 is inserted into the receiving slot 12 completely, the locking portions 34 are locked with notches 201 on the memory module 200 to retain the memory module 200 in the receiving slot 19, and the projections 31 has an outer end abutting against the stoppers 14 to prevent the latches 3 from outward rotation easily. The retaining walls 36 of the latches 3 are received in the corresponding slits 17 respectively so as to retain the latches 3 in the arm portions 10 firmly. When the memory module 200 is removed from the receiving slot 12, the gripping portions 35 are pulled outwardly so as to rotate the latches 3 relative to the insulative housing 1 outwardly. At the same time, the projections 31 pass over the corresponding stoppers 14, so that the latch 3 could be rotated outwardly to eject the memory module 200 out of the receiving slot 12.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A card edge connector for receiving a module, comprising:
    an elongated insulative housing having a receiving slot for receiving the module and at least one arm portion positioned at one end of the insulative housing, said arm portion having a pair of side walls and a recess located therebetween, each side wall having a stopper extending in the recess;
    a plurality of terminals mounted on said insulative housing and extending into the receiving slot thereof; and
    a latch adapted to be rotatably received in the recess, said latch including an ejecting portion for ejecting the module out of the receiving slot, a locking portion for locking the module into the receiving slot and a pair of projections formed on opposite side faces thereof for cooperating with the stoppers, the projection having a side surface for interfering engagement with the stopper when the latch is rotated inwardly and an outer surface for being abutted against inwardly by the stopper when the latch is received in the recess completely;
    wherein
    the side surface is coated with a lubricant film thereon, the outer surface is not coated with a lubricant film thereon.

2. The card edge connector as claimed in claim 1, wherein the side surface extends inwardly and slantwise towards the receiving slot.

3. The card edge connector as claimed in claim 2, wherein the outer surface extends outwardly and slantwise far away from the receiving slot, a first acute angle is formed between the outer surface and the side face of the latch and is larger than a second angle formed between the side surface and the side face of the latch.

4. The card edge connector as claimed in claim 1, wherein each side wall has a hole communicating with the recess, the latch has a pair of spindles formed on opposite sides thereof to be rotatably received in the holes respectively.

5. The card edge connector as claimed in claim 1, wherein the arm portion has a pair of guiding walls parallel to the side walls and a guiding slot located therebetween for receiving a side edge of the module, the guiding wall and the side wall are interconnected via a connecting wall.

6. The card edge connector as claimed in claim 5, wherein the arm portion has a pair of slits formed between the side walls and the guiding walls, the latch has a pair of retaining walls received in the slits respectively.

7. A card edge connector for receiving a module, comprising:
    an elongated insulative housing having a receiving slot for receiving the module, a plurality of passageways positioned at two lateral sides of the receiving slot, and a pair of arm portions positioned at two elongated opposite ends of the insulative housing, said arm portion having a pair of side walls and a recess located therebetween, each side wall having a stopper extending into the recess;
    a plurality of terminals received in the passageways and extending into the receiving slot thereof; and
    a pair of latches adapted to be rotatably received in the recesses, said latch including an ejecting portion for ejecting the module out of the receiving slot, a locking portion for locking the module into the receiving slot and a pair of projections formed on opposite sides thereof for cooperating with the stoppers, each stopper having an outer surface for interfering engagement with a side surface of the projection when the latch is rotated inwardly and an inner face for abutting against an outer face of the stopper inwardly when the latch is received into the recess completely; wherein
    the outer face of the stopper and the side surface of the projection are coated with lubricant films thereon, the inner face of the stopper and the outer surface of the projection are not coated with lubricant films thereon.

8. The card edge connector as claimed in claim 7, wherein the side surface of the projection extends inwardly and slantwise towards the receiving slot, the outer surface of the projection extends outwardly and slantwise far away from the receiving slot, a first acute angle is formed between the outer surface and the side face of the latch and is larger than a second angle formed between the side surface and the side face of the latch.

9. The card edge connector as claimed in claim 7, wherein said arm portion has a pair of guiding walls parallel to the side walls and a guiding slot located therebetween for receiving a side edge of the module, the guiding wall and the side wall are interconnected via a connecting wall.

10. The card edge connector as claimed in claim 9, wherein the arm portion has a pair of slits formed between the side walls and the guiding walls, the latch has a pair of retaining walls received in the slits respectively.

* * * * *